(12) United States Patent
Pan et al.

(10) Patent No.: US 11,500,243 B2
(45) Date of Patent: Nov. 15, 2022

(54) LED ASSEMBLY, LIGHT SOURCE AND LIQUID CRYSTAL DISPLAY DEVICE

(71) Applicants: Chongqing BOE Optoelectronics Technology Co., Ltd., Chongqing (CN); BOE Technology Group Co., Ltd., Beijing (CN)

(72) Inventors: Fei Pan, Beijing (CN); Yucheng Li, Beijing (CN); Shikang Ge, Beijing (CN); Hening Zhang, Beijing (CN); Wei Dai, Beijing (CN); Xufeng Tu, Beijing (CN); Zhuqing Zhang, Beijing (CN); Zhi Li, Beijing (CN); Wei Chen, Beijing (CN); Meilong Hu, Beijing (CN); Jinhong Zhang, Beijing (CN)

(73) Assignees: CHONGQING BOE OPTOELECTRONICS TECHNOLOGY CO., LTD., Chongqing (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 17/441,958

(22) PCT Filed: Feb. 18, 2021

(86) PCT No.: PCT/CN2021/076685
§ 371 (c)(1),
(2) Date: Sep. 22, 2021

(87) PCT Pub. No.: WO2021/169826
PCT Pub. Date: Sep. 2, 2021

(65) Prior Publication Data
US 2022/0163848 A1 May 26, 2022

(30) Foreign Application Priority Data
Feb. 28, 2020 (CN) .......................... 202010127790.5

(51) Int. Cl.
*G02F 1/00* (2006.01)
*G02F 1/13357* (2006.01)
*G02F 1/1335* (2006.01)

(52) U.S. Cl.
CPC .. *G02F 1/133603* (2013.01); *G02F 1/133614* (2021.01)

(58) Field of Classification Search
CPC ....... G02F 1/133602–133603; G02F 1/133614
See application file for complete search history.

(56) References Cited

U.S. PATENT DOCUMENTS 9,518,719 B2 * 12/2016 Moon .................... F21V 9/32
11,036,076 B2 * 6/2021 Huang ............. G02F 1/133603
(Continued)

FOREIGN PATENT DOCUMENTS

CN      1981388 A    6/2007
CN   103094263 A    5/2013
(Continued)

OTHER PUBLICATIONS

First Office Action dated May 8, 2021 for application No. CN202010127790.5 with English translation attached.
(Continued)

*Primary Examiner* — Gerald J Sufleta, II
(74) *Attorney, Agent, or Firm* — Nath, Goldberg & Meyer; Joshua B. Goldberg

(57) ABSTRACT

The present disclosure provides an LED assembly, a light source, and a liquid crystal display device. The LED assembly includes: a substrate; a plurality of blue LED chips which are disposed on the substrate at intervals and have different emission wavelengths; a white light phosphor layer which is disposed on the substrate and covers the plurality of blue LED chips; and a sealing frame which is disposed on the substrate and is configured to encapsulate the plurality of
(Continued)

blue LED chips and the white light phosphor layer. The LED assembly encapsulates the blue LED chips having different emission wavelengths together, which can avoid LED mixing from an LED encapsulation source, thereby saving cost. Moreover, problems such as nonuniform images and chromatic aberration are basically avoided when the LED assembly is applied to an LCD module.

11 Claims, 1 Drawing Sheet

(56) References Cited

U.S. PATENT DOCUMENTS

| | | | | |
|---|---|---|---|---|
| 11,050,006 | B2* | 6/2021 | Ye | H01L 33/58 |
| 2004/0021629 | A1 | 2/2004 | Sasuga et al. | |
| 2009/0262515 | A1* | 10/2009 | Lee | H01L 25/0753 |
| | | | | 362/293 |
| 2016/0372637 | A1* | 12/2016 | Huang | H01L 33/50 |
| 2019/0101792 | A1* | 4/2019 | Yang | G09G 3/3607 |
| 2020/0033527 | A1* | 1/2020 | Lee | G02F 1/133512 |

FOREIGN PATENT DOCUMENTS

| | | |
|---|---|---|
| CN | 104950515 A | 9/2015 |
| CN | 106322225 A | 1/2017 |
| CN | 107121837 A | 9/2017 |
| CN | 207070414 U | 3/2018 |
| CN | 108321150 A | 7/2018 |
| CN | 109671831 A | 4/2019 |
| CN | 110867437 A | 3/2020 |
| CN | 111261624 A | 6/2020 |
| CN | 211295091 U | 8/2020 |

OTHER PUBLICATIONS

Second Office Action dated Nov. 17, 2021 for application No. CN202010127790.5 with English translation attached.

* cited by examiner

LED ASSEMBLY, LIGHT SOURCE AND LIQUID CRYSTAL DISPLAY DEVICE

This is a National Phase Application filed under 35 U.S.C. 371 as a national stage of PCT/CN/2021/076685, filed on Feb. 18, 2021, an application claiming priority to Chinese patent application No. 202010127790.5, filed on Feb. 28, 2020, the disclosure of each of which is incorporated herein by reference.

TECHNICAL FIELD

The present disclosure relates to the technical field of liquid crystal display devices, and particularly relates to an LED assembly, a light source, and a liquid crystal display device.

BACKGROUND

LEDs (light-emitting diodes) used in a commonly-used liquid crystal display module (LCD module) generally have emission wavelengths of about 450 nm. An LCD module with an anti-blue light effect generally adopts LEDs having longer emission wavelengths, because the longer the emission wavelengths are, the better the anti-blue light effect is. However, too long wavelengths may cause abnormal white balance and poor image quality, and the anti-blue light effect is optimal when the emission wavelengths are 455 nm. However, emission wavelengths of produced LEDs are generally distributed within a certain range, and the LEDs having emission wavelengths of 455 nm account for less than 30% of all the produced LEDs. In order to balance the anti-blue light effect and the image quality of the LCD module, as well as take cost into consideration, a mixed surface mounting manner of strip lights is generally adopted, that is, LEDs having different emission wavelengths are mounted on a flexible printed circuit (FPC) board alternately and at intervals. As it is not easy to mark the LEDs having different emission wavelengths on a surface mounting production line and the LEDs are easily mounted by mistake, a surface mounting factory is required to carry out mixing management, which causes increase in management cost of the surface mounting factory; in addition, light emitted from adjacent LEDs may cause chromatic aberration or hotspot due to inconsistent wavelengths, affecting the image display effect.

Therefore, LED related techniques adopted in the present LCD module remain to be improved.

SUMMARY

According to one aspect of the present disclosure, an LED assembly is provided. According so to an embodiment of the present disclosure, the LED assembly includes: a substrate; a plurality of blue LED chips which are disposed on the substrate at an interval and have different emission wavelengths; a white light phosphor layer which is disposed on the substrate and covers the plurality of blue LED chips; and a sealing frame which is disposed on the substrate and is configured to encapsulate the plurality of blue LED chips and the white light phosphor layer.

According to an embodiment of the present disclosure, the plurality of blue LED chips are connected in parallel.

According to an embodiment of the present disclosure, the plurality of blue LED chips include at least one anti-blue LED chip, and the anti-blue LED chip has an emission wavelength in a range of 452 nm to 458 nm.

According to an embodiment of the present disclosure, the plurality of blue LED chips include at least one anti-blue LED chip and at least one non-anti-blue LED chip, and the non-anti-blue LED chip has an emission wavelength less than 452 nm.

According to an embodiment of the present disclosure, all of the plurality of blue LED chips are anti-blue LED chips.

According to an embodiment of the present disclosure, the emission wavelengths of the plurality of anti-blue LED chips have an average value of 455 nm.

According to an embodiment of the present disclosure, a difference between emission wavelengths of two adjacent blue LED chips is greater than or equal to 1 nm.

According to an embodiment of the present disclosure, the LED assembly further includes a plurality of controllers which are disposed in one-to-one correspondence with the plurality of blue LED chips, and each controller is configured to control on and off of a corresponding one of the plurality of blue LED chips.

According to an embodiment of the present disclosure, the LED assembly includes two blue LED chips, and the emission wavelengths of the two blue LED chips satisfy any one of the following conditions: the emission wavelengths of the two blue LED chips are 452 nm and 458 nm, respectively; the emission wavelengths of the two blue LED chips are 453 nm and 457 nm, respectively; and the emission wavelengths of the two blue LED chips are 454 nm and 456 nm, respectively.

According to an embodiment of the present disclosure, the blue LED chips are gallium nitride LED chips.

According to an embodiment of the present disclosure, the white light phosphor layer comprises at least one of $K_2SiF_6$ and Mn-doped phosphor.

According to another aspect of the present disclosure, a light source is provided. According to an embodiment of the present disclosure, the light source includes the above LED assembly.

According to yet another aspect of the present disclosure, a liquid crystal display device is provided. According to an embodiment of the present disclosure, the liquid crystal display device includes the above light source.

DETAILED DESCRIPTION

The embodiments of the present disclosure are described in detail below. The embodiments described below are illustrative and merely intended to explain the present disclosure, and cannot be understood as limitations of the present disclosure. The embodiments without indication of specific techniques or conditions are implemented according to techniques or conditions described in documents of the art or according to product specifications. The reagents or instruments used without indication of manufacturers are all conventional products which are available in the market.

In order to at least solve one of the technical problems in the related art to a certain extent, the present disclosure provides, inter aha, an LED assembly. According to the LED assembly, LED mixing can be avoided from the source, cost can be saved, and problems such as nonuniform images and chromatic aberration can be avoided; or different levels of anti-blue light effect can be achieved.

Figure 1:
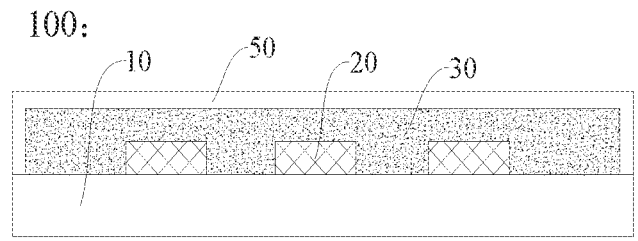
FIG. 1 is a schematic cross-sectional view of a structural of an LED assembly according to an embodiment of the present disclosure.
Figure 2:
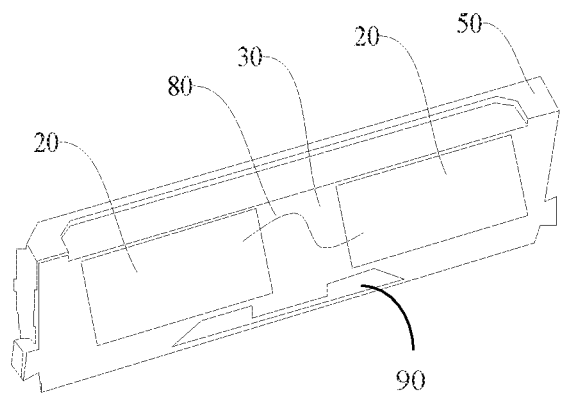
FIG. 2 is a schematic structural diagram of a section of an LED assembly according to another embodiment of the present disclosure.

According to one aspect of the present disclosure, an LED assembly is provided. According to an embodiment of the present disclosure, referring to FIG. 1 and FIG. 2, an LED assembly 100 includes: a substrate 10; a plurality of blue LED chips 20 which are disposed on the substrate 10 at an interval and have different emission wavelengths; a white light phosphor layer 30 which is disposed on the substrate 10 and covers the plurality of blue LED chips 20; and a sealing frame 50 which is disposed on the substrate 10 and is configured to encapsulate the plurality of blue LED chips 20 and the white light phosphor layer 30. In the LED assembly, the blue LED chips having different emission wavelengths are encapsulated together to form an LED particle, which avoids a surface mounting factory carrying out LED mixing management, thereby saving cost (as LEDs having different emission wavelengths are automatically classified after production, extra cost will not be generated). In addition, a distance between the plurality of blue LED chips 20 having different emission wavelengths in the LED assembly according to the present disclosure is far smaller than a distance between LED chips having different emission wavelengths in the existing mixed surface mounting manner of strip lights, so that problems such as nonuniform images and chromatic aberration are substantially avoided when the LED assembly is applied to an LCD module.

According to some embodiments of the present disclosure, the substrate may be a base substrate without a circuit structure, that is, the substrate only plays a supporting role, and an electrical connections between the plurality of blue LED chips and between the plurality of blue LED chips and outside may be implemented by other wiring and connecting lines. According to other embodiments of the present disclosure, the substrate may be a printed circuit (e.g., an FPC) board provided with a circuit structure, and in this case, a predetermined circuit structure has been printed and formed on the printed circuit board. The blue LED chips only needs to be disposed at corresponding positions of the substrate, the electrical connection between the plurality of blue LED chips are implemented through the circuit structure on the printed circuit board while the substrate plays the supporting role.

Figure 3:
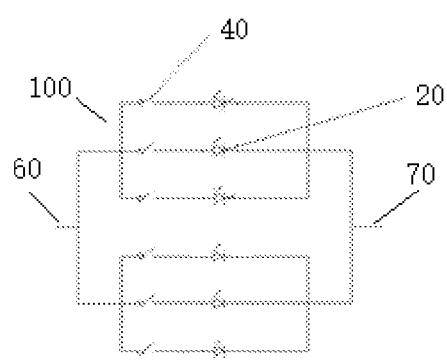
FIG. 3 is a schematic diagram of a circuit of an LED assembly according to an embodiment of the present disclosure.

According to an embodiment of the present disclosure, referring to FIG. 3, the plurality of blue LED chips 20 may be connected in parallel. In this way, the plurality of blue LED chips can) operate independently without affecting each other. Even though one or more blue LED chips are disconnected, other blue LED chip(s) can still normally operate. Moreover, the plurality of blue LED chips 20 may be controlled at the same time, which is beneficial for the plurality of blue LED chips 20 in the LED assembly to achieve a better light mixing effect.

According to an embodiment of the present disclosure, referring to FIG. 3, the LED assembly 100 further includes a plurality of controllers 40 which are disposed in one-to-one correspondence with the plurality of blue LED chips 20, and each controller 40 is configured to control on and off of one of the blue LED chips 20. In an embodiment, under the control of the controllers 40, the LED chips emit light when a positive voltage 60 and a negative voltage 70 are applied. By controlling, by the controllers 40, the LED chips having different emission wavelengths to emit light, whether each blue LED chip emits light can be independently controlled, and further an emission waveband of the LED assembly can be adjusted as required, which can achieve switching between an anti-blue light mode and a non-anti-blue light mode and switching between different levels of anti-blue light effects. The specific type of the controllers in the present disclosure is not particularly limited, which may be any circuit that can function as a switch, such as a transistor. In the present disclosure, the controllers may be formed on the substrate in advance, and thus they are simple in structure and easy to be implemented.

According to an embodiment of the present disclosure, the emission wavelengths of the plurality of blue LED chips can be flexibly selected according to actual needs. In some embodiments, the plurality of blue LED chips includes at least one anti-blue LED chip and at least one non-anti-blue LED chip. In this way, the switching between the anti-blue light mode and the non-anti-blue light mode can be achieved by controlling the plurality of controllers 40 as required. In some other embodiments, all of the plurality of blue LED chips may be anti-blue LED chips, so that a better anti-blue light effect can be achieved. In the present disclosure, the anti-blue LED chip refers to an LET) chip having an emission wavelength in the range of 452 nm to 458 nm (for example, 452 nm, 453 nm, 454 nm, 455 nm, 456 nm, 457 nm, 458 nm, etc.), and the non-anti-blue LED chip refers to an LED chip having an emission wavelength less than 452 nm (for example, 451 nm, 450 nm, 449 nm, 448 nm, etc.). The longer the emission wavelength of the anti-blue LED chip is, the less a proportion of harmful blue light is, and the better the anti-blue light effect is; however, an anti-blue light LED chip having a too long emission wavelength will cause abnormal color temperature and white balance and reduce color gamut of the module. The anti-blue LED chip having an emission wavelength in the above range has a better anti-blue light effect and a relatively small negative effect on the image.

According to an embodiment of the present disclosure, a difference between emission wavelengths of two adjacent blue LED chips may be flexibly selected as required. In some embodiments, the difference between the emission wavelengths of two adjacent blue LED chips is greater than or equal to 1 nm (for example, 1 nm, 2 nm, 3 nm, 4 nm, 5 nm, 6 nm, 7 nm, 8 nm, 9 nm, 10 nm, etc.). In this way, different effects can be flexibly achieved according to different use needs, so as to be suitable for a variety of different use environments.

According to an embodiment of the present disclosure, the emission wavelengths of the plurality of anti-blue LED chips have an average value of 455 nm, so that the blue LED chips having different emission wavelengths can be fully used to achieve an optimal anti-blue light effect. In some embodiments, the LED assembly includes two blue LED chips, and the emission wavelengths of the two blue LED chips satisfy any one of the following conditions: the emission wavelengths of the two blue LED chips are 452 nm and 458 nm, respectively; the emission wavelengths of the two blue LED chips are 453 nm and 457 nm, respectively; and the emission wavelengths of the two blue LED chips are 454 nm and 456 nm, respectively. In this way, produced LED chips can be fully utilized, at the same time, the optimal anti-blue light effect can be achieved, and LED chip loss is greatly reduced. Certainly, the number of the blue LED chips in the LED assembly according to the embodiments of the present disclosure is not limited to two, and may be three, four or more as long as the emission wavelengths of the plurality of blue LED chips included in the LED assembly has an average value of 455 nm. For example, when the LED assembly includes three blue LED chips, the emission wavelengths of the three blue LED chips may be 452 nm, 455 nm, and 458 nm, respectively, or may be 453 nm, 455 nm, and 457 nm, respectively, or may be 454 nm, 455 nm, and 456 nm, respectively. According to the embodiments of the present disclosure, the specific type and structure of the blue LED chips are not particularly limited. In some embodiments, the blue LED chip may be a LED chip with a horizontal structure or a vertical structure, and specifically may include structures such as a base substrate; a p-type semiconductor layer, art n-type semiconductor layer, a p-electrode, and an n-electrode. The base substrate may be a sapphire base substrate, a silicon base substrate, or a silicon carbide base substrate, the p-type semiconductor layer and the n-type semiconductor layer may be adjusted according to the emission color, and the p-electrode and the n-electrode may be metal electrodes, such as silver electrodes. In one example, the blue LED chip in the LED assembly may be a gallium nitride LED chip, that it, the semiconductor material in the LED chip is gallium nitride.

According to an embodiment of the present disclosure, the white light phosphor layer can emit white light under excitation of blue light emitted by the LED chips, and thus can be applied to a backlight source of a liquid crystal display device. In some embodiments, the white light phosphor layer may include at least one of Mn-doped phosphor (for example, Mn-doped. $K_2SiF_6$) and $K_2SiF_6$. In one example, the white light phosphor layer includes $K_2SiF_6$, and in this case, it has a high luminous efficiency, wide material source, and low cost.

According to an embodiment of the present disclosure, the sealing frame 50 can protect the LED chips from water-oxygen corrosion, and thus service stability is improved and service life is prolonged. The material of the sealing frame is not particularly limited in the present disclosure, and specifically may be epoxy resin.

According to an embodiment of the present disclosure, an LED assembly is provided with a plurality of (for example, two) blue LED chips 20, which are connected in parallel through a connecting wire 80, a white light phosphor layer 30 covers the plurality of blue LED chips 20, and both the blue LED chips 20 and the white light phosphor layer 30 are encapsulated by the sealing frame 50. An encapsulation adhesive 90 wrapping metal wires is disposed on a side of the blue LED chips 20 away from the white light phosphor layer 30, the metal wires are configured to supply power to the blue LED chips 20, and the encapsulation adhesive 90 can protect the metal wires while achieving an insulating function.

According to another aspect of the present disclosure, a light source is provided. According to an embodiment of the present disclosure, the light source includes the above LED assembly. The light source has simple manufacturing method, easy operation, and lower cost, and problems such as nonuniform images and chromatic aberration are substantially avoided when the light source is applied to a liquid crystal display device.

According to an embodiment of the present disclosure, the light source may include a base substrate and a plurality of LED assemblies as described above, and the plurality of LED assemblies are disposed on the base substrate at an interval. In some embodiments, the light source is applied to a backlight module of a liquid crystal display device. A conventional backlight module generally includes the above light source, a light guide plate, an optical film (for example, a diffusion screen, a prism sheet, etc.), a structural member (for example, an iron frame, or a rubber frame), and the like. Reference may be made to a conventional process for details, which are not repeatedly described herein.

According to yet another aspect of the present disclosure, a liquid crystal display device is provided. According to an embodiment of the present disclosure, the liquid crystal display device includes the above light source, and has better uniformity of display images, and problems such as non-uniform images and chromatic aberration are basically avoided.

It should be understood that the specific type of the liquid crystal display device is not particularly limited, for example, the liquid crystal display device may be an NT mode liquid crystal display device, an IPS liquid crystal display device, or an ADS liquid crystal display device. Besides the light source, the liquid crystal display device may further include necessary structures and components of a conventional liquid crystal display device, such as an array substrate, a liquid crystal layer, a sealant, a color filter substrate, and a polarizer, which are not repeatedly described herein.

In a specific embodiment, the above LED assembly includes two anti-blue LED chips, which have emission wavelengths of 453 nm and 457 nm, respectively. The LED assembly, as a light source, is assembled into a side-type backlight module of a liquid crystal display device, then the side-type backlight module is further assembled into a liquid crystal display device, and the liquid crystal display device is subjected to spectrum detection. It is detected that light with wavelengths in the range of 415 nm to 455 nm accounts for 37.6% of light with wavelengths in the range of 400 nm to 500 nm. The result indicates that the LED assembly achieves a desired anti-blue light effect. In addition, when observing display images of the liquid crystal display device by naked eyes, problems of image non-uniformity, and chromatic aberration do not exist at the light incidence side, and the display quality is high.

In the description of the specification, the description with reference to the terms such as "an embodiment", "some embodiments", "an example", "a specific example", and "some examples" indicates that features, structures, materials, or characteristics, which are described in combination with the embodiment or example, are included in at least one embodiment or example of the present disclosure. In the specification, the illustrative descriptions with reference to the above terms not necessarily refer to the same embodiment or example. Furthermore, the specific described features, structures, materials, or characteristics can be combined in a suitable manner in any one or more embodiments or examples. In addition, different embodiments or examples described in the specification and features therein can be combined by those skilled in the art if no conflict occurs.

Although the embodiments of the present disclosure are shown and described above, it so should be understood that the above embodiments are exemplary and should not be construed as limiting the present disclosure, and changes, modifications, substitutions and variations can be made to the above embodiments by those skilled in the art within the scope of the present disclosure.

What is claimed is:
1. An LED assembly, comprising:
   a substrate;
   a plurality of blue LED chips disposed on the substrate at an interval and having different emission wavelengths;
   a white light phosphor layer disposed on the substrate and covering the plurality of blue LED chips; and a sealing frame disposed on the substrate and configured to encapsulate the plurality of blue LED chips and the white light phosphor layer,
wherein the plurality of blue LED chips are all anti-blue LED chips having an emission wavelength in a range of 452 nm to 458 nm, and the plurality of blue LED chips have different emission wavelengths.

2. The LED assembly of claim 1, wherein the plurality of blue LED chips are connected in parallel.

3. The LED assembly of claim 1, wherein the emission wavelengths of the plurality of anti-blue LED chips have an average value of 455 nm.

4. The LED assembly of claim 3, wherein a difference between emission wavelengths of two adjacent blue LED chips is greater than or equal to 1 nm.

5. The LED assembly of claim 1, further comprising a plurality of controllers, wherein the plurality of controllers are disposed in one-to-one correspondence with the plurality of blue LED chips, and each controller is configured to control on and off of a corresponding one of the plurality of blue LED chips.

6. The LED assembly of claim 3, wherein the LED assembly comprises two blue LED chips, and the emission wavelengths of the two blue LED chips satisfy any one of the following conditions:

the emission wavelengths of the two blue LED chips are 452 nm and 458 nm, respectively;

the emission wavelengths of the two blue LED chips are 453 nm and 457 nm, respectively; and the emission wavelengths of the two blue LED chips are 454 nm and 456 nm, respectively.

7. The LED assembly of claim 1, wherein the blue LED chips are gallium nitride LED chips.

8. The LED assembly of claim 1, wherein the white light phosphor layer comprises at least one of $K_2SiF_6$ and Mn-doped phosphor.

9. A light source, comprising the LED assembly of claim 1.

10. A liquid crystal display device, comprising the light source of claim 9.

11. The LED assembly of claim 2, further comprising a plurality of controllers, wherein the plurality of controllers are disposed in one-to-one correspondence with the plurality of blue LED chips, and each controller is configured to control on and off of a corresponding one of the plurality of blue LED chips.

* * * * *